United States Patent
Laude

(10) Patent No.: US 6,452,442 B1
(45) Date of Patent: Sep. 17, 2002

(54) APPARATUS FOR OBTAINING NOISE IMMUNITY IN ELECTRICAL CIRCUITS

(75) Inventor: David P. Laude, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 1027 days.

(21) Appl. No.: 08/567,379

(22) Filed: Dec. 4, 1995

(51) Int. Cl.⁷ .................................................. H03B 1/00
(52) U.S. Cl. ...................................... 327/551; 327/379
(58) Field of Search ..................... 326/31, 33; 327/309, 327/310, 311, 379, 380, 381, 382, 384, 389, 551

(56) References Cited

U.S. PATENT DOCUMENTS

| | | | |
|---|---|---|---|
| 4,609,834 A | 9/1986 | Gal | 307/443 |
| 4,613,771 A | 9/1986 | Gal | 307/443 |
| 4,857,765 A | 8/1989 | Cahill et al. | 307/443 |
| 5,041,741 A * | 8/1991 | Steele | 307/443 |
| 5,317,183 A | 5/1994 | Hoffman et al. | 257/369 |
| 5,329,170 A | 7/1994 | Rainal | 307/303.1 |
| 5,508,651 A * | 4/1996 | Burri | 327/535 |

FOREIGN PATENT DOCUMENTS

| | | | |
|---|---|---|---|
| JP | 2284515 | * | 11/1990 |
| JP | 3183211 | * | 8/1991 |

OTHER PUBLICATIONS

Grob, "Basic Electronics", McGraw–Hill Book Company, New York, p 560, 1984.*

* cited by examiner

*Primary Examiner*—Jeffrey Zweizig
(74) *Attorney, Agent, or Firm*—Blakely, Sokoloff, Taylor & Zafman LLP

(57) ABSTRACT

A noise immunity circuit has a distributed electrical plane to which noise susceptible components are coupled. Also, in a close proximity are noise generating circuits that generate electrical noise onto the distributed electrical plane that affect the noise susceptible components. A coupling means is used to couple the noise susceptible circuits to the distributed electrical plane so that the noise of the distributed electrical plane is common to all points in the noise susceptible circuit. Also, inputs and power to the circuit are coupled to the distributed electrical plane so that the common noise is imposed upon them. Coupling preferably takes place through a variety of capacitors and resistors so that high frequency noise is coupled to the noise susceptible circuit.

20 Claims, 3 Drawing Sheets

APPARATUS FOR OBTAINING NOISE IMMUNITY IN ELECTRICAL CIRCUITS

FIELD OF THE INVENTION

The present invention relates to electrical circuits susceptible to noise and, more specifically, to means for eliminating noise effects on susceptible circuits.

BACKGROUND OF THE INVENTION

Integrated circuits are increasingly using both digital and analog circuits on the same monolithic die. As the integration density and switching speeds of noisy digital circuits continue to increase with technological advancements so do the noise levels and the adverse effects of noise on susceptible circuits. Consequently, the integration of analog or other noise susceptible circuitry with high speed digital logic is becoming increasingly difficult.

Switching noise from logic circuits is coupled into noise susceptible circuits through the integrated circuit substrate and power lines. Switching noise can have a serious performance impact on noise susceptible circuits. Noise problems range from analog circuits running out of specification to more severe problems such as erratic circuit operation.

Clock distribution systems, the logic circuits they control and output drivers are a major source of the noise generated from integrated circuits. When logic circuits switch state while driving a capacitive load, a rapid capacitor charging current flow generates an undesirable noise disturbance that is coupled to the integrated circuit substrate. The noise is typically coupled either by parasitic capacitive coupling between noisy circuits and the substrate or through direct connection of a power supply of a noisy circuit to the substrate. The load capacitances are undesired, but inherent in any circuit. The problem is multiplied since integrated circuits typically contain hundreds to hundreds of thousands of logic circuit gates that, when switched simultaneously, create extreme voltage transients that may upset other circuits.

One method for separating analog and digital circuits is by using a higher resistivity integrated circuit substrate. A higher resistivity substrate helps to electrically partition the integrated circuit substrate into quiet and noisy areas, separated by a relatively high resistive path. One problem with higher resistivity substrates is that noise is never completely separated since noise can still couple to common supplies. The noise may affect the operation of sensitive circuits. Another problem with this technique is that the trend is for high density, lower cost processes that use a low resistivity substrate. A low resistivity substrate does not allow effective separation of digital and analog noise for substrate partitioning. Furthermore, most integrated circuit fabrication companies require that logic grounds connect electrically to the substrate for reliability and robustness thus increasing noise to the substrate.

Using a low resistivity integrated circuit substrate also presents noise problems. One technique to reduce digital noise is by isolating the substrate noise from as many analog circuit components as possible by using an N-well. An N-well, however, does not allow total isolation of the digital noise from the analog circuit since some noise will always be capacitively coupled to and through the N-well. Further, some components must lie directly on the substrate and cannot make use of an N-well. Because isolation differs according to component structure, this technique always results in differing amounts of noise coupled to different parts of the analog circuit. The variances will be seen as a differential signal by the circuit. Another method for reducing noise coupled into analog circuits using a low resistivity integrated circuit substrate is robustly connecting the substrate to a good external ground with a low impedance path. One problem with such a method is that extra pins must be provided on the integrated circuit to connect to the external ground. Another problem is that the high frequency components of the switching circuits make it impossible to obtain a low impedance path to external ground through inductive bond wires and package lead frame in a cost effective way and without using many ground pins. Typically, spare pins are either not available or may require increasing the package size to accommodate these extra pins. This method may reduce the effects of noise significantly, but for highly sensitive circuits may not provide adequate noise reduction.

Another method for reducing noise effects is using fully differential circuits. Fully differential circuits are good at rejecting noise that is common to their inputs. Several problems exist in the employment of fully differential circuits. One problem is that when laying out a circuit it is hard to match the noise induced on its differential signal lines. For example, a mismatch of just a few fempto-farads of capacitive coupling between differential signal lines to a noise signal can impair the performance. Another problem with differential circuits is that in automotive applications differential circuits are not a typical functional requirement since they are more complex, more area intensive and thus, more costly than single ended circuits. Yet another problem is that the ability to reject common mode noise in differential circuits decreases with increasing noise frequency.

Another method for improving noise immunity is to sample when the noise has decayed sufficiently. Typical systems sample data just before a new clock edge and after sufficient quieting from the previous clock edge occurs. The problem with such a method is that for faster clock frequencies, typically more than 4 MHz (considered low by today's standards), the substrate noise does not have time to sufficiently quiet during sampling and as technology advances clock frequencies will continue to increase.

Each of the methods described above reduces noise to a certain extent. Conventional thinking, however, is that separation or filtering of noise are the best methods to reduce the effects of noise. It is evident an improved method for eliminating the effects of noise would solve a long felt need.

SUMMARY OF THE INVENTION

The object of the invention is to enable analog or other noise susceptible circuits that share a common distributed electrical plane with digital or other noise generating circuits to achieve excellent noise immunity from noise induced on the plane. The present invention is a complete paradigm shift from prior art noise immunity solving methods.

The present invention has a distributed electrical plane and a reference electrical portion non-ideally coupled to the distributed electrical plane. Noise generating components are coupled to the distributed electrical plane and induce noise onto said distributed electrical plane. Noise susceptible components are also coupled to the distributed electrical plane. A coupling means for coupling the noise susceptible circuits to the distributed electrical plane more evenly distributes noise to the noise susceptible circuits so that the noise is common and indistinguishable throughout the noise susceptible circuits and the noise susceptible circuits operate with immunity to the noise.

By coupling noise from the distributed electrical plane (e.g., substrate of an integrated circuit) into the analog circuitry of an integrated circuit and coupling noise from the substrate into the analog inputs and outputs of the integrated circuit, the analog circuit acts as if no noise is present, since all the noise is common throughout the analog circuit.

One advantage of the present invention is substrate noise immunity is superior to other known methods of noise reduction. Another advantage is that noise reduction remains effective even at high noise frequencies where other techniques loose their ability to work and without the need for more costly integrated circuit packaging.

BRIEF DESCRIPTION OF THE DRAWINGS

These and other objects and advantages of the present invention will be apparent to those skilled in the art upon reading the following description with reference to the accompanying drawings, in which.

DETAILED DESCRIPTION OF THE PREFERRED EMBODIMENT

Figure 1:
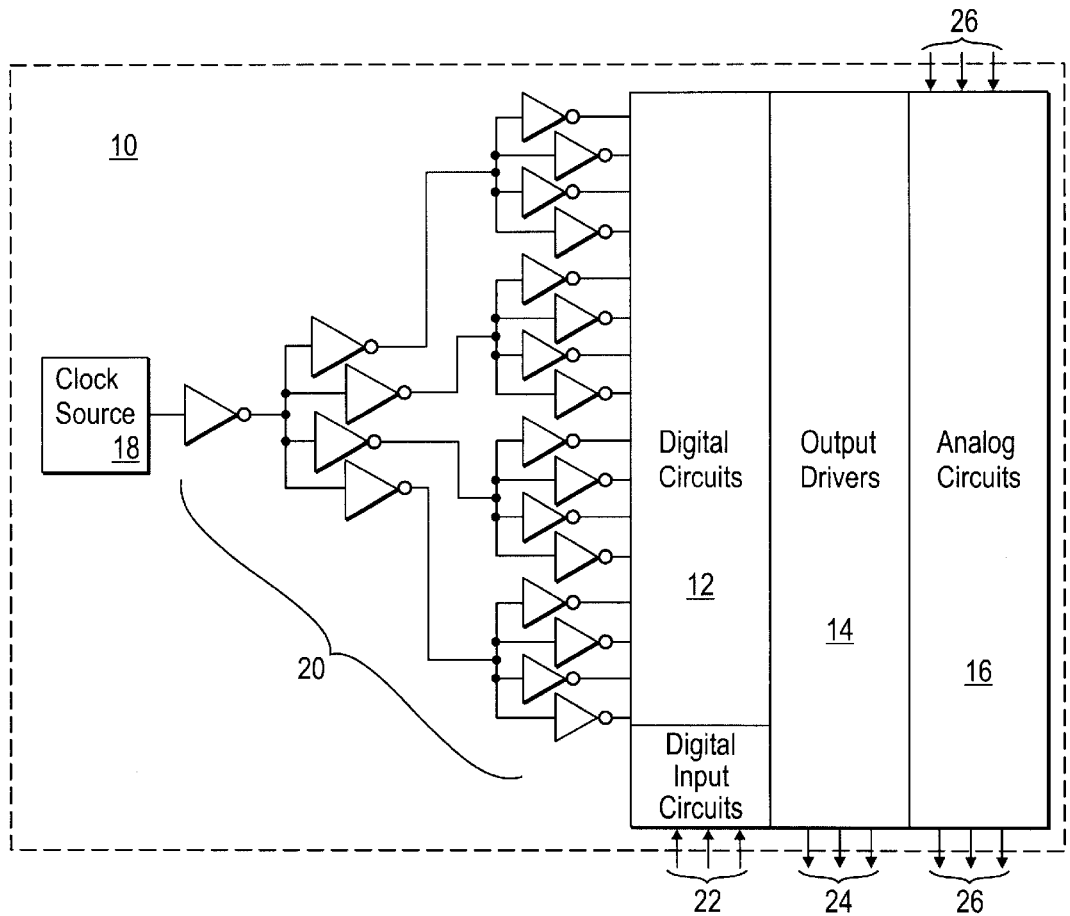
FIG. 1 is a block schematic of an integrated circuit.

Referring to FIG. 1, an integrated circuit 10 is comprised of various digital circuits 12, output drivers 14 and analog circuits 16. Preferably integrated circuit 10 is comprised of a single substrate, a clock source 18 and a clock distribution circuit 20 to control the timing of the switching of digital circuits 12. Various functions may be performed by integrated circuit 10 that involve processing and outputting information. Digital input circuits 22 receive information from external sources for processing by integrated circuit 10. Output drivers 14 have digital outputs 24 that are used to control various functions outside integrated circuit 10. Analog circuits 10 have analog inputs 26 for receiving analog signals for processing by the integrated circuit 10. Analog outputs 28 supply various analog signals outside integrated circuit 10.

Clock source 18 and clock distribution circuit 20 are a major source of interference in integrated circuits and particularly to sensitive analog circuits. The noise generated by clock source 18, clock distribution circuits 20 and digital circuits 12 are significant since they each drive parasitic capacitive loads with part of the capacitance connecting to the substrate. Another source of noise is that output drivers 14 typically drive significant capacitive loads. Typically interference in the form of current spikes is translated into voltage transients as the current spikes flow through parasitic inductances and resistances within the integrated circuit bond wires and package lead frame used to connect the internal integrated circuit to the external package.

The present invention is described with respect to an integrated circuit. However, this technique may also be applied to a printed circuit boards, ceramic hybrids or other electronic assemblies having one or more conductors if one of the layers has some common switching noise imposed upon it.

Figure 2:
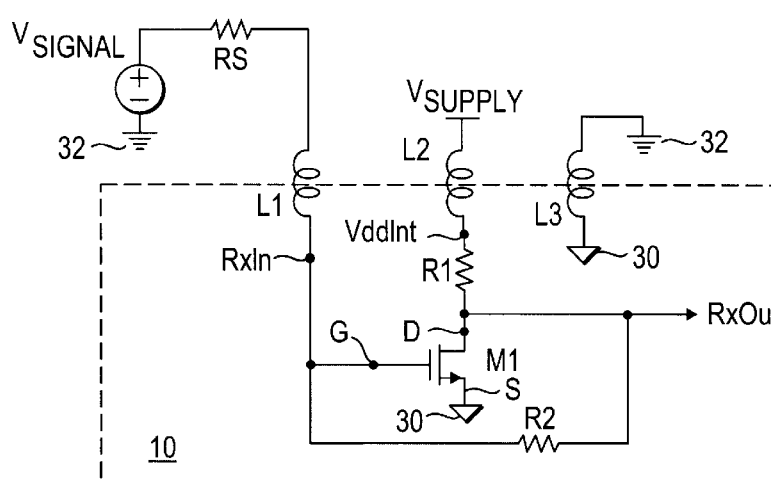
FIG. 2 is a schematic of a simple analog summing amplifier.

Referring now to FIG. 2, a simple summing amplifier is shown as an example of an analog circuit. Various other analog circuits may be used. Other noise producing circuitry is located proximate to the analog portion causing some adverse effect on the analog circuit. This circuit does not contain the noise reducing characteristics of the present invention.

The purpose of the summing amplifier is to buffer and invert an externally applied signal and pass it on to the next stage in the integrated circuit. The summing amplifier has an amplifier M1 having a gate G, a source S and a drain D. Drain D is connected to a supply voltage $V_{supply}$ through a resistor R1. Gate G is connected to drain D through resistor R2. Output of amplifier M1 is signal RxOut that originates from drain D. Source S is connected to substrate ground 30.

External connections to integrated circuit 10 are represented by inductances L1, L2 and L3. The inductances represent the parasitic inductances of integrated circuit package and bond wires.

External signal $V_{signal}$ is connected to gate G through an external resistor RS and through a parasitic inductance L1. $V_{signal}$ is referenced to external ground 32. Resistor RS helps determine the voltage gain of the buffer and protect integrated circuit 10 from large $V_{signal}$ values.

The integrated circuit has an input power supply with a power supply voltage $V_{supply}$. Voltage $V_{supply}$ is connected to drain D through parasitic inductance L2 and resistor R1.

Substrate ground 30 is coupled to external ground 32 by parasitic inductance L3. A reference point RxIn is located at gate G. Another reference point VddInt is located between resistor R1 and parasitic inductance L2. External ground 32 is a reference portion that may be a ground plane, a node of a circuit or other common electrical connection.

Figure 3:
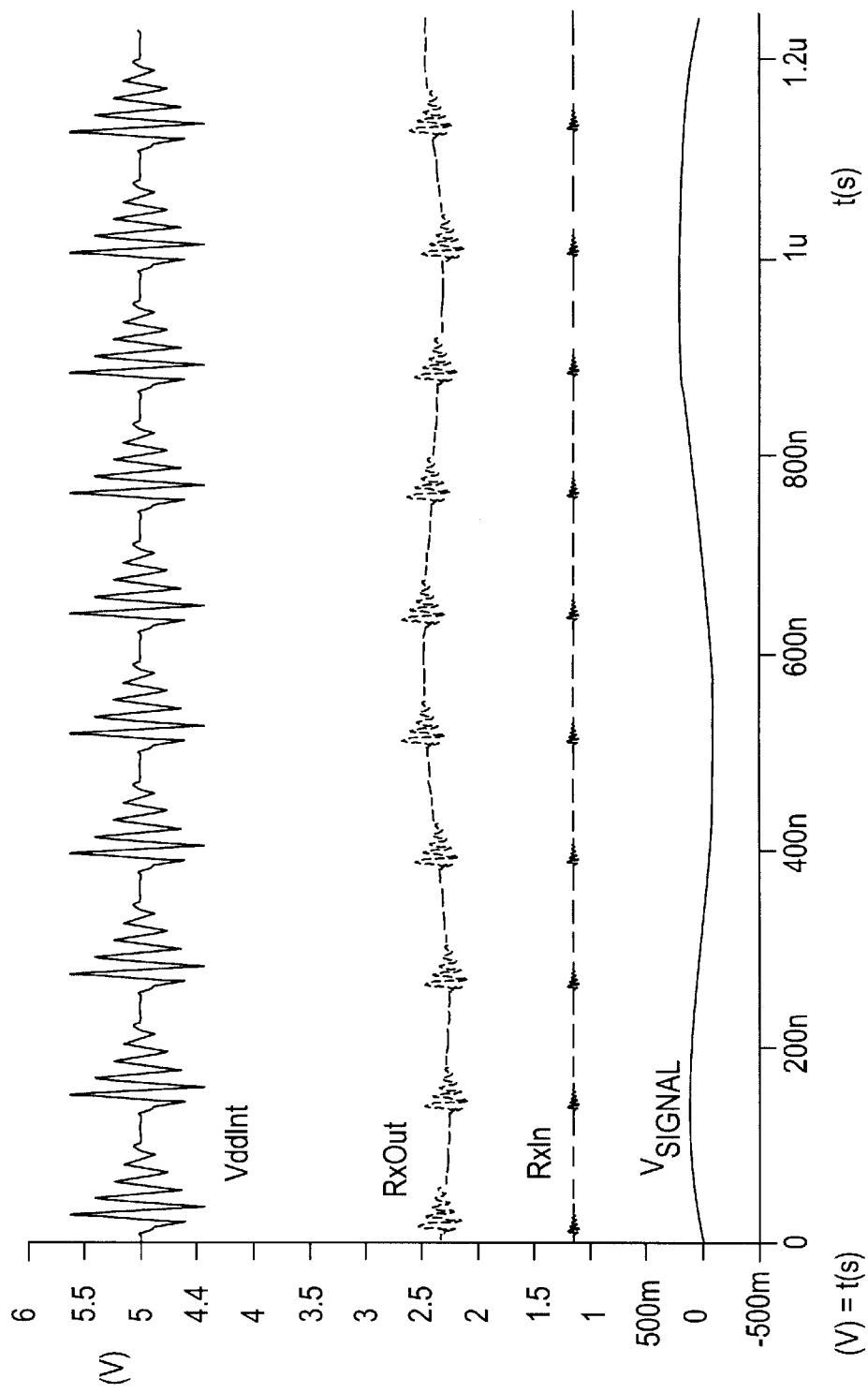
FIG. 3 is a wave form plot of the certain outputs of the schematic of FIG. 2.

Referring now to FIG. 3, a wave form plot is shown of signals VddInt, RxOut, RxIn and $V_{signal}$. Each of the signals except $V_{signal}$ has noise imposed upon it from digital switching activity on the integrated circuit as coupled by the substrate. The noise is periodic in nature which is common for clock noise. $V_{signal}$ does not have the noise imposed upon it since $V_{signal}$ is referenced to external ground 32. All other signals are referenced to substrate ground. Consequently, problems arise when processing signals are not commonly referenced. Since it is not practical to effectively have the same voltages on the integrated circuit internal ground as on the external ground due to inductances and noise, once signals enter the integrated circuit, they should be referenced to the substrate that is commonly the integrated circuit internal ground.

Figure 4:
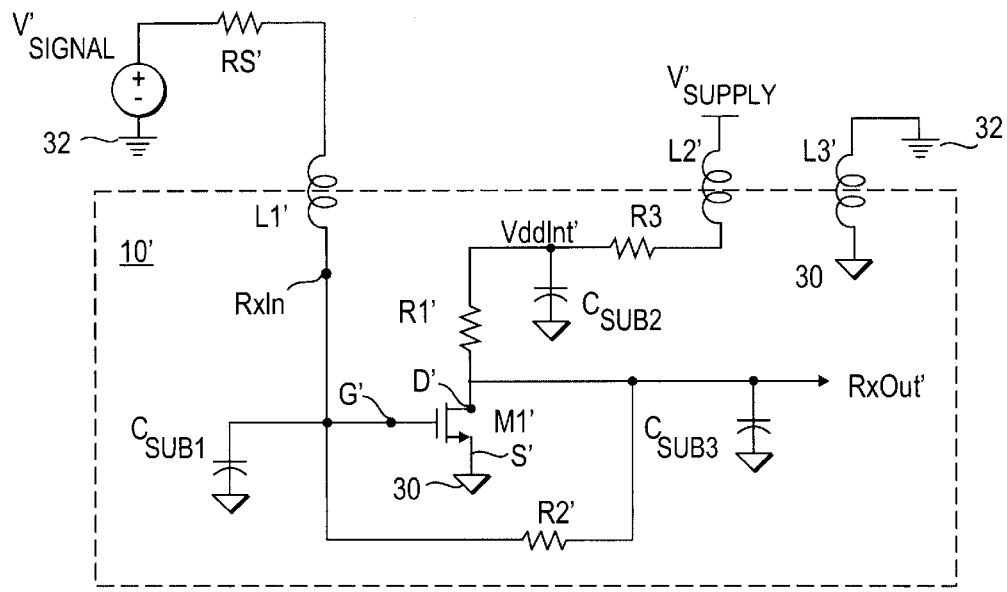
FIG. 4 is a schematic summing amplifier of FIG. 2 having noise reduction according to the present invention.

Referring now to FIG. 4, the summing amplifier circuit is shown with noise coupling according to the present invention. Each of the common components to FIG. 2 have been primed and will not be discussed further. For noise reduction capacitors $C_{sub1}$, $C_{sub2}$, $C_{sub3}$ and resistor R3 have been added. Capacitor $C_{sub1}$ is connected to the gate G'. Resistor R3 is connected between resistor R1' and parasitic inductance L2'. Capacitor $C_{sub2}$ is connected between R1' and R3. Capacitor $C_{sub3}$ is connected to output RxOut. Each capacitor $C_{sub1}$, $C_{sub2}$ and $C_{sub3}$ is also connected to substrate ground 30.

Capacitor $C_{sub1}$ is connected to gate G' and coupled to the input signal $V'_{signal}$ so that gate G' will have the noise from substrate reference 30 imposed upon it. External resistor RS' with $C_{sub1}$ forms a dual purpose filter that allows the relatively low $V_{signal}$ frequencies to enter M1' through resistor R1' while at the same time coupling high frequency substrate noise to the gate of M1'. $C_{sub2}$ and R3 have been added to help couple high frequency substrate noise to the supply voltage $V'_{supply}$ before being input into drain D of M1'. R3 also helps to isolate the substrate noise from the integrated circuit's supply pin. The best results have been obtained when each input of integrated circuit 10 have some coupling to the substrate. It is also preferred to couple as many circuit nodes and circuit components as convenient to the substrate to achieve the best possible noise distribution. Much of the previously undesired inherent parasitic capacitive coupling that was crippling in the prior art is now advantageous in the present invention.

The exact capacitances are not critical. It is, however, preferable to provide more capacitance. The values of the capacitors for this example range from 2.5 picofarads to about 10 picofarads. Each of the capacitances do not need to be the same.

Subsequent analog stages to this circuit should also use theses techniques for noise immunity. In many cases the analog signal will be processed into a digital signal. Once digitized there is no further need to utilize the present invention.

In cases where it is not appropriate to couple substrate noise directly onto an analog input pin, noise immunity may still be obtained by applying the present invention to subsequent analog stages driven from the input pin.

For analog output pins that drive only input pins of the same integrated circuit, i.e., through some external components, coupling noise to the output pins will aid in noise immunity.

For analog output pins that drive external circuits, noise can be filtered out externally using conventional low pass filtering since noise is typically a nuisance.

Figure 5:
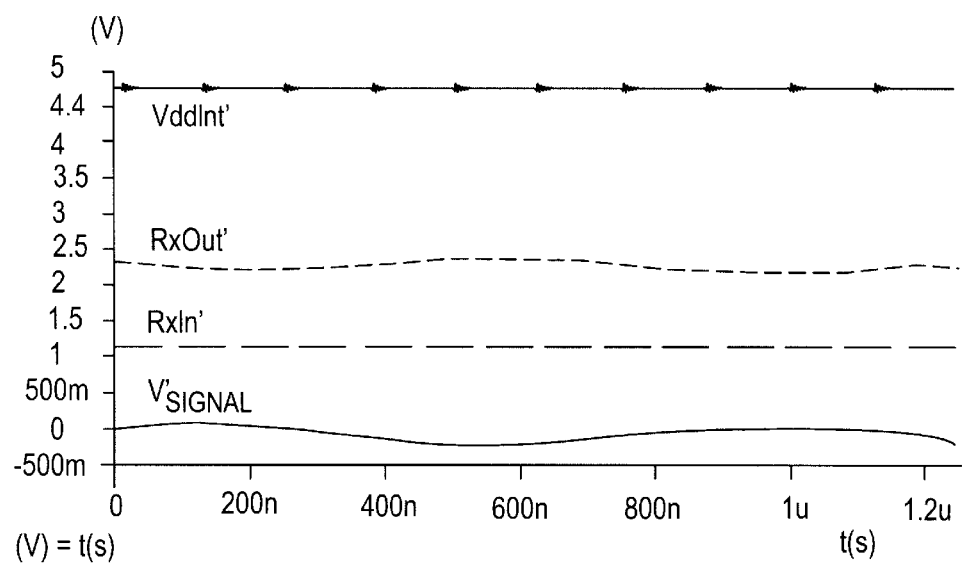
FIG. 5 is a wave form plot of certain outputs in the schematic of FIG. 4.

Referring now to FIG. 5, wave form plots of VddInt', RxOut', RxIn' and $V_{signal}$' are shown with respect to the substrate ground. The noise present on the wave forms of FIG. 3 have been essentially eliminated by the present invention.

As would be evident to one skilled in the art, several modifications of the invention may be made while still being within the scope of the appended claims. For example, the previous examples used a P-substrate where the substrate was the common plane. If the substrate is an N-substrate, the substrate would be the power plane.

I claim:

1. A noise-immune circuit comprising:
  a distributed electrical conductor;
  noise generating components coupled to said distributed electrical conductor inducing noise onto said distributed electrical conductor;
  noise susceptible components coupled to said distributed electrical conductor; and
  coupling means for coupling said noise susceptible circuits to said distributed electrical conductor, said coupling means distributing noise to said noise susceptible circuits so that said noise is common throughout said noise susceptible circuits and said noise susceptible circuits operates with immunity to said noise.

2. A noise-immune circuit as recited in claim 1 wherein said coupling means comprises capacitors.

3. A noise-immune circuit as recited in claim 1 further comprising signal inputs having input signals, said coupling means coupled between said signal input and said distributed electrical conductor.

4. A noise-immune circuit as recited in claim 3 further comprising a reference electrical portion coupled to said distributed electrical conductor wherein said input signals are referenced to said reference portion.

5. A noise-immune circuit as recited in claim 1 further comprising a reference electrical portion coupled to said distributed electrical conductor and a power supply input referenced to said reference electrical portion, said coupling means coupling said power supply input to said distributed electrical conductor.

6. A noise-immune circuit as recited in claim 1 wherein said coupling means for said power supply includes a resistor connected in series between said power supply and said circuit and a capacitor connected between said circuit and said distributed electrical plane.

7. A noise-immune circuit as recited in claim 1 wherein said noise susceptible components comprise nodes, each of said nodes having coupling means coupling said noise susceptible circuit to said distributed electrical conductor.

8. A noise-immune circuit as recited in claim 1 wherein said noise susceptible circuits comprise analog circuits and said noise generating circuits comprise digital logic circuits.

9. A noise-immune circuit as recited in claim 1 wherein said distributed electrical conductor comprises an integrated circuit substrate.

10. A noise-immune circuit as recited in claim 1 wherein said distributed electrical conductor comprises a printed circuit board plane.

11. A noise-immune circuit comprising:
  a distributed electrical plane;
  a reference electrical portion coupled to said distributed electrical plane;
  noise generating components coupled to said distributed electrical plane inducing noise onto said distributed electrical plane;
  noise susceptible components coupled to said distributed electrical plane;
  a power supply;
  an electrical signal input; and
  coupling means for coupling said noise susceptible circuits, said power supply and said electrical signal input to said distributed electrical plane, said coupling means distributing noise to said noise susceptible circuits so that said noise is common throughout said noise susceptible circuits and said noise susceptible circuits operates with immunity to said noise.

12. A noise-immune circuit as recited in claim 11 wherein said coupling means comprises capacitors.

13. A noise-immune circuit as recited in claim 11 wherein said coupling means for said power supply includes a resistor connected in series between said power supply and said circuit and a capacitor connected between said circuit and said distributed electrical plane.

14. A noise-immune circuit as recited in claim 11 wherein said noise susceptible components are connected at nodes, each of said nodes having coupling means coupling said noise susceptible circuit to said distributed electrical plane.

15. A noise-immune circuit as recited in claim 11 wherein said noise susceptible circuits comprise analog circuits and said noise generating circuits comprise digital logic circuits.

16. A noise-immune circuit as recited in claim 11 wherein said distributed electrical plane comprises an integrated circuit substrate.

17. A noise-immune circuit as recited in claim 11 wherein said distributed electrical plane and said reference electrical portion comprises a printed circuit board plane.

18. A noise-immune circuit comprising:
  a distributed electrical plane;
  a reference electrical portion inductively coupled to said distributed electrical plane;
  noise generating components coupled to said distributed electrical plane inducing noise onto said distributed electrical plane;

noise susceptible components coupled to said distributed electrical plane;

a power supply referenced to said reference portion;

an electrical signal input referenced to said reference portion; coupling means for coupling said noise susceptible circuits, said power supply and said electrical signal input to said distributed electrical plane, said coupling means distributing noise to said noise susceptible circuits so that said noise is common throughout said noise susceptible circuit; and output means referenced to said distributed electrical plane operating with immunity to said noise.

19. An integrated circuit comprising:

a substrate;

digital circuitry formed on said substrate, wherein said digital circuitry creates noise signals during operation that are coupled into said substrate resulting in substrate noise signals;

analog circuitry formed on said substrate; and a plurality of noise-coupling capacitors connected between said substrate and respective points in said analog circuitry, said noise-coupling capacitors distributing said substrate noise signals substantially equally to said points so that said analog circuitry operates with substantial immunity to said substrate noise signals.

20. The integrated circuit of claim 19 further comprising:

an external supply pin; and a resistance coupling said external supply pin to said analog circuitry at a respective point where said substrate noise signals are coupled to said analog circuitry by a noise-coupling capacitor.

* * * * *